United States Patent [19]
Kazem-Goudarzi et al.

[11] Patent Number: 5,742,396
[45] Date of Patent: *Apr. 21, 1998

[54] METHOD AND APPARATUS FOR DETECTING OBSTRUCTED VACUUM NOZZLES

[75] Inventors: Vahid Kazem-Goudarzi, Sunrise; Alex Marron; Val Jean F. Hillman, both of Plantation, all of Fla.

[73] Assignee: Motorola, Inc., Schaumburg, Ill.

[*] Notice: The term of this patent shall not extend beyond the expiration date of Pat. No. 5,615,012.

[21] Appl. No.: 781,464

[22] Filed: Jan. 11, 1997

Related U.S. Application Data

[63] Continuation of Ser. No. 657,129, Jun. 3, 1996, abandoned.
[51] Int. Cl.⁶ .................................................. G01B 11/02
[52] U.S. Cl. .................. 356/394; 356/384; 356/372; 250/227.14
[58] Field of Search ................................. 356/241, 244, 356/246, 394, 434, 432, 440, 436, 411; 385/146, 147; 250/227.14

[56] References Cited

U.S. PATENT DOCUMENTS

| | | | |
|---|---|---|---|
| 4,265,476 | 5/1981 | Elgart | 294/64 R |
| 4,459,743 | 7/1984 | Watanabe et al. | 29/740 |
| 4,615,579 | 10/1986 | Whitehead | 350/96.1 |
| 5,018,936 | 5/1991 | Izumi et al. | 414/752 |
| 5,039,224 | 8/1991 | O'Rourke et al. | 356/434 |
| 5,160,086 | 11/1992 | Kuykendal et al. | 239/18 |
| 5,175,030 | 12/1992 | Lu et al. | 428/30 |
| 5,309,544 | 5/1994 | Saxe | 385/146 |
| 5,339,382 | 8/1994 | Whitehead | 385/146 |
| 5,416,684 | 5/1995 | Pearce | 362/340 |
| 5,615,012 | 3/1997 | Kazem-Goudarzi et al. | 356/384 |
| 5,631,165 | 5/1997 | Chupp et al. | 436/43 |

FOREIGN PATENT DOCUMENTS

| | | |
|---|---|---|
| 63-202095 | 2/1987 | Japan . |
| 63-202096 | 2/1987 | Japan . |
| 63-202097 | 2/1987 | Japan . |
| 1-126939 | 11/1987 | Japan . |
| 4-35097 | 2/1992 | Japan . |
| 4-179200 | 6/1992 | Japan . |
| 5-76099 | 10/1993 | Japan . |
| 6-125194 | 5/1994 | Japan . |
| 7-302999 | 11/1995 | Japan . |

*Primary Examiner*—Frank G. Font
*Assistant Examiner*—Michael P. Stafira
*Attorney, Agent, or Firm*—Dale W. Dorinski

[57] ABSTRACT

A method and apparatus for detecting whether a vacuum nozzle on a high speed component placement machine is obstructed. A vacuum nozzle (10) has a hollow tube with a vacuum port (25) and an opening (12) at one end. A plastic light guide is connected to the vacuum nozzle such that one portion of the light guide is exposed to be illuminated (50) by a remote light source (30). The light guide transmits light to illuminate the opening (12) from the interior of the vacuum nozzle. The amount of light exiting the illuminated opening is measured (55) by a remotely located light detector (35). A decision (60) is made as to whether the opening is obstructed by comparing the measured illuminated opening to a predetermined standard.

20 Claims, 4 Drawing Sheets

METHOD AND APPARATUS FOR DETECTING OBSTRUCTED VACUUM NOZZLES

This is a continuation of application Ser. No. 08/657,129, filed Jun. 3, 1996, and now abandoned.

CROSS REFERENCE TO RELATED APPLICATION

This application is related to pending U.S. application Ser. No. 08/610,300 filed Mar. 4, 1996, entitled "Method for Detecting Obstructed Nozzles" by Kazem-Gourdarzi et. al., assigned to Motorola, Inc. and now U.S. Pat. No. 5,615,012 issued Mar. 25, 1997.

TECHNICAL FIELD

This invention relates in general to methods of vacuum pick-up of components.

BACKGROUND

All electronics assembly manufacturing lines require some form of component placement system. The simplest component placement equipment is a steady hand and a pair of tweezers. More complex systems use automatic component placement machines, and, as in manual placement, the object is to pick up a part from a certain position and place it at a new location on a substrate. Pick-up is normally achieved either in manual or automated systems by using a vacuum chuck which is sized to suit the component. Components are presented to the pick-up position using an automatic component feeder. In all cases, two important criteria for component placement are accuracy and reliability. Repeatability of component placement is typically aided by the use mechanical centering jaws on the placement head. The placement head then typically moves from the pick up position to the desired location on the substrate and deposits the component on the substrate by releasing the vacuum, thus allowing the component to gently fall into the desired location. Components are typically placed into an adhesive or a solder paste that prevents the movement of the component during subsequent operations. Both the solder paste and the adhesive have a certain degree of tackiness which tends to hold the component in position.

Two major approaches are typically taken on automated pick and place equipment for surface mount technology. The first is to use a dedicated head for each component. This head transfers components from a feeder to the substrate or printed circuit board (PCB). A conveyer moves the boards past a line of placement heads which progressively populate the board. This type of system is typically used for very high volume, long run situations. The second approach is a single head machine which is microprocessor controlled and contains numerous interchangeable chucks which can rapidly pick parts from a variety of feeders and populate a single board at a time. This approach is more appropriate for short to medium runs with many different assemblies, since set-up time is relatively short and the machines are very flexible.

In the case of single head component placement machines with multiple chucks, 10 or more vacuum chucks are on a single head. It is extremely important that each of the chucks be maintained in a pristine operating condition. If any of the chucks is misaligned or inoperative, the placement of the components will be in error or the component will be missing from the circuit board. High speed machines that have turret heads are capable of placing very high numbers (14,000-50,000 per hour) of small components, and the problem of vacuum chuck or vacuum nozzle clogging is a significant one. The small orifice in the vacuum chuck is easily obstructed by environmental debris or particulates. In order to ensure continued up-time and reliability of machines, the vacuum chucks must be scrupulously cleaned on a regular basis. In addition, there is no way of determining whether a vacuum nozzle is obstructed until it becomes completely inoperative, at which time defective product has already been manufactured.

It would be desirable and a significant improvement in the state of the art, if a system could be devised that could detect a clog or obstructed vacuum nozzle in a proactive manner. Such a method would reduce the maintenance cost of the high speed component placement machines, increase the quality of the assembled electronics product and maintain the optimum cycle time based on the placement program.

DETAILED DESCRIPTION OF THE PREFERRED EMBODIMENT

Clogged vacuum nozzles on high speed component placement systems contribute to the placement defects and cycle time increase of an automated production line. The novel method of detecting whether or not a vacuum nozzle opening on a high speed component place machine is obstructed encompasses illuminating the vacuum nozzle with a remote light source. The vacuum nozzle is typically a hollow tube having an opening at one end, the opening serving as a tip face that picks a component from a supply device and transports the component to a desired location on a printed circuit board. A light guide attached to the vacuum nozzle has one portion that is illuminated by a light source that is located remotely from the vacuum nozzle assembly. The light guide is arranged with respect to the vacuum nozzle so that when the light guide is illuminated, light passes through the guide to illuminate the inside of the hollow tube, and thusly lights up the opening in the tip face from the inside of the vacuum nozzle. As the rotary head containing the nozzles passes by the remote light source, the interior of the nozzle is illuminated by the light guide, and the tip face is imaged by a measuring device, typically a camera. The measuring device measures the amount of light, if any, emanating from the illuminated vacuum nozzle opening. This measurement is compared to a set of standard criteria, and a determination is then made as to whether or not the opening is clogged. If the opening is not obstructed, it will be seen as a bright light. If the opening is completely obstructed the bore of the nozzle will not be seen and it will be dark. If the nozzle is partially obstructed, a combination of light and dark areas will be seen that represents the amount and degree of obstruction of the nozzle. By lighting the interior of the nozzle and then imaging the tip face from the exterior of the nozzle, any debris or contamination in the interior of the nozzle is "backlit" and becomes very easy to detect.

Figure 1:
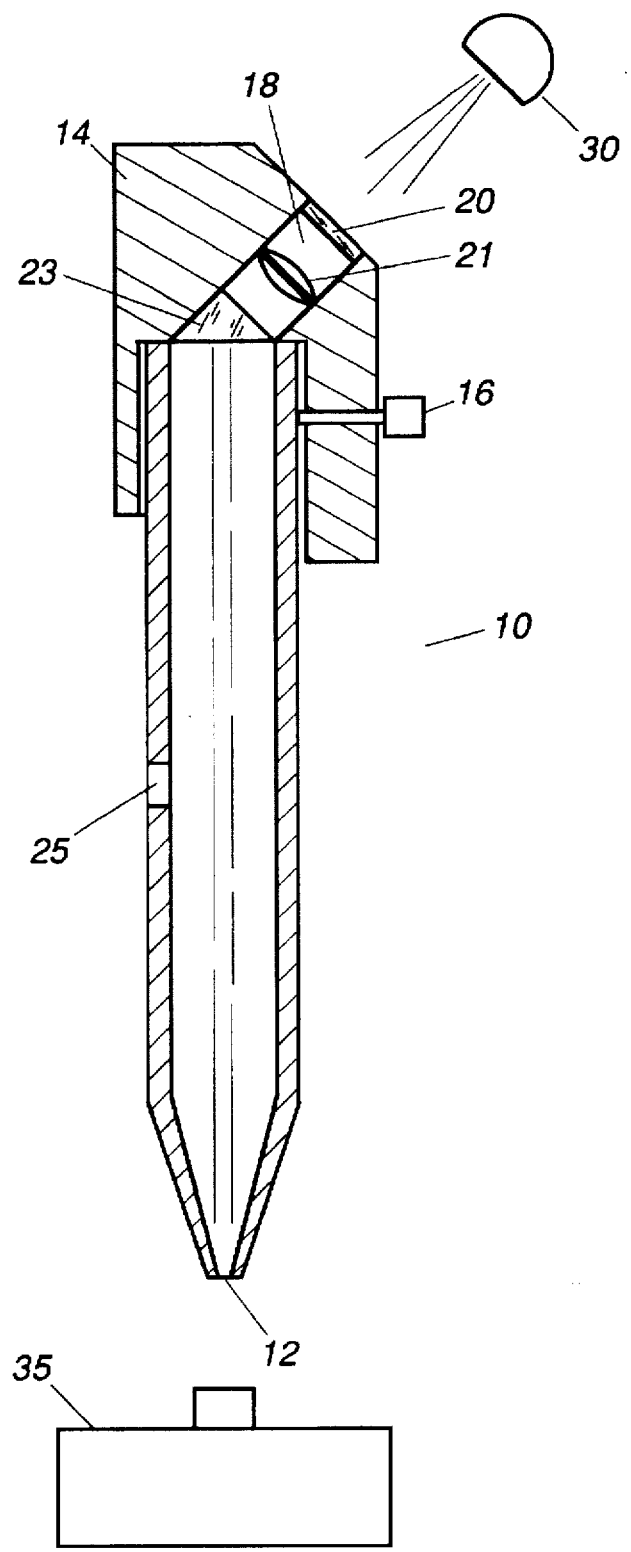
FIG. 1 is a cross-sectional schematic view of a vacuum nozzle in accordance with a first embodiment of the invention.

Referring now to FIG. 1, a pictorial schematic view of a nozzle in accordance with the invention is show. A vacuum nozzle 10 typically consists of a hollow tube having a concentric bore down the center of the tube. One end of the nozzle 10 has an opening 12 that serves as the vacuum chuck to pick up the component (not shown). Although the drawing figure shows the tip of the nozzle as tapered, this is clearly an option and it may be cut off square if desired. The other end of the vacuum nozzle 10 is used to attach the nozzle to the turret head (not shown) of the component placement system. This end of the nozzle is typically called the nozzle block 14. In one particular application, the nozzle block 14 is attached to the replaceable vacuum nozzle 10 by means of a retaining screw 16. The nozzle block 14 serves to fixture and align the nozzle 10 in proper orientation in the turret head.

In one embodiment of the invention, an opening such as a window 20 is situated in the nozzle block such that the window directs ambient light into the interior of the vacuum nozzle 10 by passing through a channel 18 in the nozzle block. Depending on the exact configuration of the particular nozzle mounting scheme, there may be additional components such as one or more lenses 21 or prisms 23 that serve to direct and/or focus the incoming light more efficiently. In those situations where a nozzle block is not employed, the window and/or lens is incorporated into the nozzle itself. In any case, the exact placement of the window, associated channel and/or lens is not critical, however, it is important that they be arranged in such a manner to illuminate the interior of the vacuum nozzle and thereby the opening 12 in the tip face, without interfering with the normal operation of the vacuum nozzle (i.e. not unduly restricting the vacuum passages within the nozzle).

In a second embodiment of the invention (shown in FIG. 2), the nozzle block 14 is a light guide fabricated from a suitable plastic, glass or ceramic material. Plastic light guides, also known as light pipes or light conduits, are well known in the literature, and are disclosed in U.S. Pat. No. 4,260,220, which is incorporated herein by reference. Briefly, one end of the light guide 15 serves to gather the light from the light source 30, and the light guide conducts this light along its optical axis 28. The light guide is formed of structured materials and operates on the basis of near-total internal reflection. Eventually, the conducted light rays falling within the guide's acceptance angle encounter an internal diffusely reflecting surface (the light extractor 24) which redirects a substantial portion of the incident light into directions which cannot be confined within the guide by total internal reflection. Such redirected light rays are accordingly able to escape from the light guide. Transparent plastics such as polycarbonates and acrylics (available from, among others, Minnesota Mining and Manufacturing Company, for example, 3M Optical Lighting Film) are typically used as light guides. These light guides have been used to form luminaries and other objects in U.S. Pat. Nos. 4,937,716; 5,339382; 5,309,544; and 4,615,579. They have also been used as light pipes for light emitting diodes (LED), and one such light pipe, known as the Optopipe™ Light Pipe, is sold by the Dialight Corporation, a Roxboro Group Company, in the U.S., Tokyo and Singapore. The Optopipe™ Light Pipe acts as a conduit for light, routing it from the light source to the intended viewing angle, which may be perpendicular to the axis of the light source. A plastic light guide 15 was made from an Optopipe™ Light Pipe that was modified and configured in a manner similar to the conventional nozzle block and was connected to the vacuum nozzle. The light guide conducted light along the optical axis around a 90° bend in the guide, and when a red LED was placed at on end of the light guide, a bright circle of light was seen at the tip face of the vacuum nozzle. The modified Optopipe™ Light Pipe served to efficiently conduct the light into the interior of the nozzle in a manner bright enough to allow a camera to image the tip face and provide clear pictures of various states of obstruction of the nozzles. Thus, one embodiment of the invention will realize the conventional metal nozzle block being replaced by a nozzle block that partially or totally consists of the plastic light guide. Obviously, some portions of the plastic nozzle block can be rendered opaque in order to limit the amount of background light impinging on the viewing device.

In a third embodiment of the invention (shown in FIG. 3), the metal nozzle block 14 has the plastic light guide formed within. For example, the empty channel 18 shown in FIG. 1 is now filled with appropriate transparent plastic material to form the plastic light guide 22, and the light extractor 24 is situated either directly above the upper opening of the vacuum nozzle or is situated partially inside the nozzle. This configuration provides the rigidity and structural integrity associated with the metal nozzle block 14 along with the advantages of the plastic light pipe.

Figure 2:
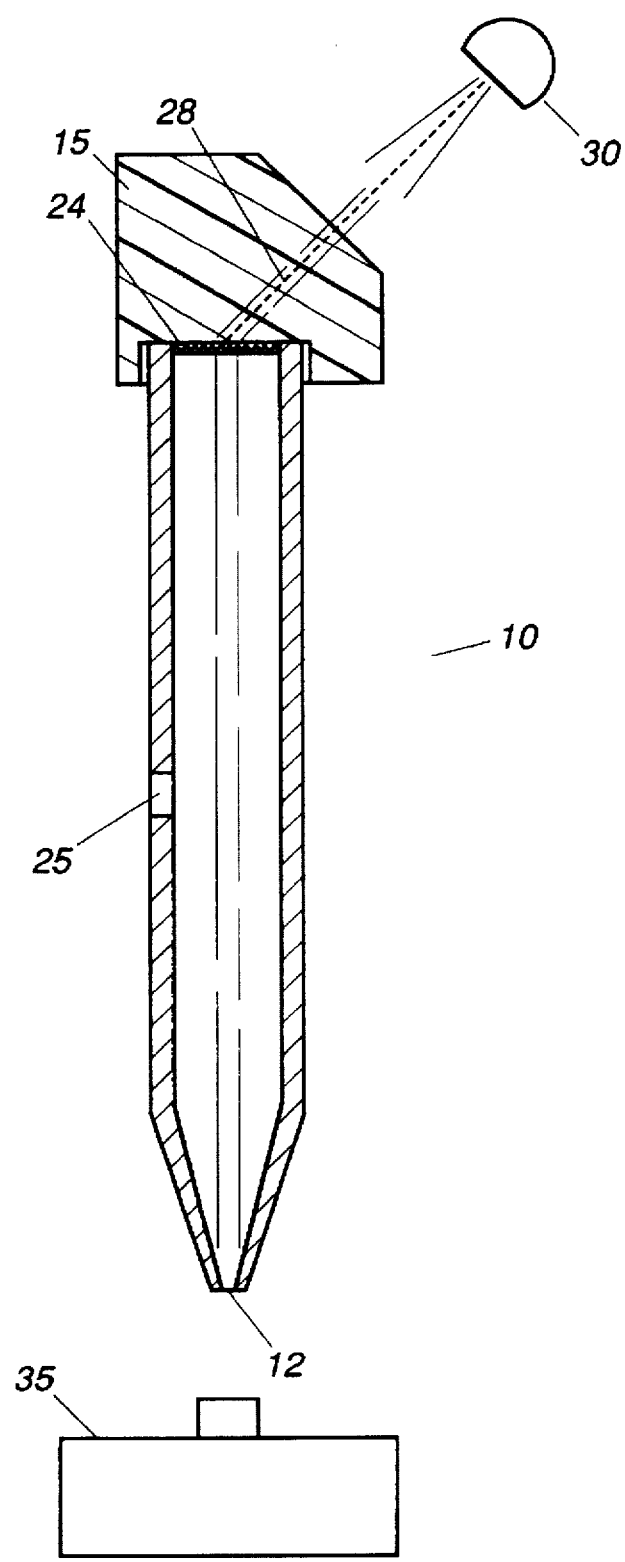
FIG. 2 is a cross-sectional schematic view of a vacuum nozzle in accordance with a second embodiment of the invention.
Figure 3:
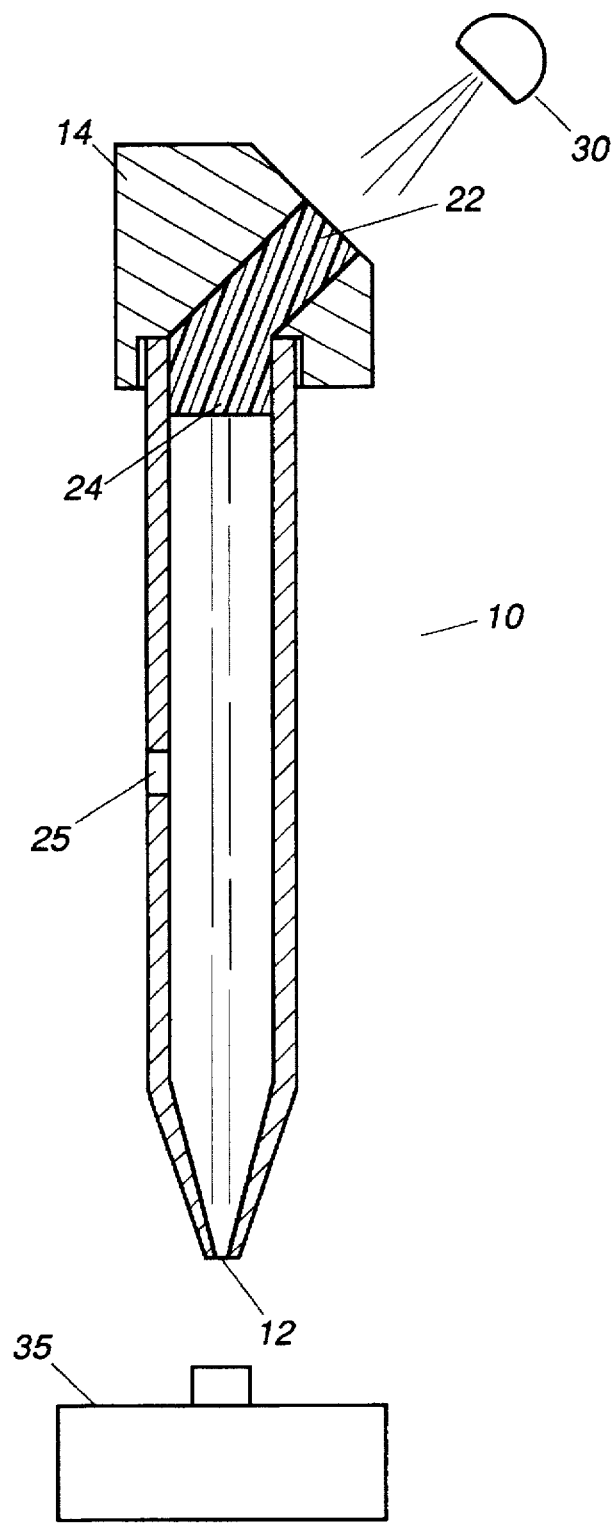
FIG. 3 is a cross-sectional schematic view of a vacuum nozzle in accordance with a third embodiment of the invention.

Referring now to FIGS. 1–3, a vacuum port 25 is also located in the vacuum nozzle and is used to draw the vacuum on the nozzle to pick up the component. A light source 30 is located remotely to the vacuum nozzle. The light source 30 is dissociated from the vacuum nozzle, i.e. it is not physically connected to in any manner. This enables the vacuum nozzle to freely rotate and move on the turret without encumbrance by wires or other power sources. The remote light source may be a dedicated light such as a light emitting diode, a laser, or simply ambient light provided by the workplace lighting fixtures. An optical measuring device 35 is also mounted remotely to the vacuum nozzle 10 and is used to determine whether or not the opening 12 is obstructed. The optical measuring device 35 may consist of any number of means which can measure light, such as a camera, a light meter, a photo diode, etc. and need not be restricted to the visible range of the electromagnetic spectrum. The use of ultraviolet and/or infrared light is an equally acceptable alternative to the use of visible light. Advantages accrued by remotely locating the optical measuring device 35 away from the nozzle are similar to those accrued by the use of the remote light source 30. Since the optical measuring device is not attached to the nozzle in any way, it does not encumber the nozzle and allows unrestricted freedom of movement.

Figure 4:
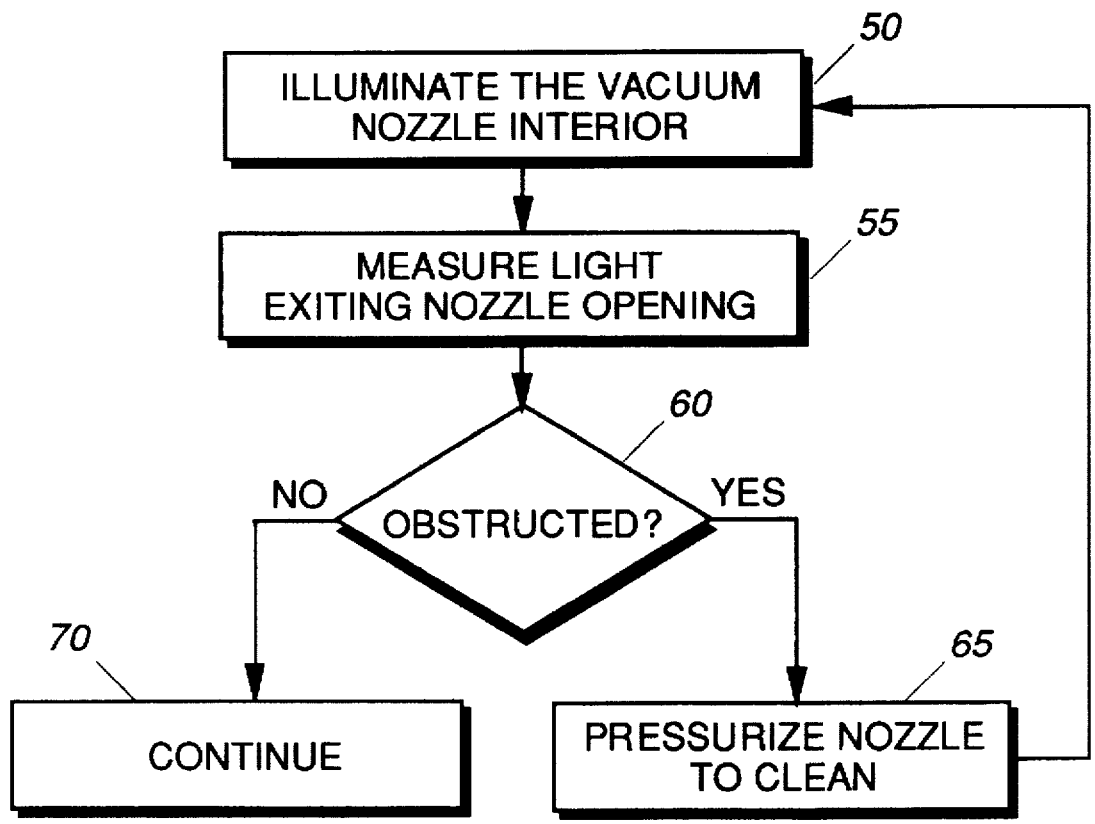
FIG. 4 is a flow chart of a process in accordance with the invention.

Referring now to FIG. 4, in practice the remote light source illuminates one end of the light guide (step 50). Light passes through the light guide and exits at the opposite end to illuminate the interior of the vacuum nozzle. The amount of light exiting the vacuum nozzle is measured (step 55) by the remotely located optical measuring device. The decision is then made as to whether or not the nozzle is obstructed (step 60). The measurement of light emanating from the nozzle opening is an inverse function of the degree of obstruction of the nozzle opening. That is, obstructed nozzles pass little or no light, and clear or unobstructed nozzles pass a great deal of light. The decision mechanism employed in step 60 is typically a software algorithm resident in the machine operating system. However, in less sophisticated systems it may be manually performed. By comparing to a set of standards, (typically the software algorithm will use a look-up table), a decision is made as to whether or not the nozzle is clogged. If the nozzle is obstructed, an attempt may be made to clear the nozzle by pressurizing it with a pressurized gas such as air or nitrogen at a level above ambient pressure (step 65). At this point the process is repeated, that is the nozzle is again illuminated and light coming out the opening is measured and a decision is made as to whether the nozzle is obstructed. The intent is that the pressurized air will dislodge and blow out any debris that may be blocking the nozzle. If the attempt to clear the nozzle was successful, the machine turret continues in its normal way of picking components off a feeder and placing them on the substrate (step 70). It should be obvious to the reader that the iteration of steps can be performed a number of times. For example, the operator may set the machine parameters to make three attempts to clear the nozzle, and if it is not clear on the third attempt, then the nozzle is flagged or labeled by the software as being inoperative. This takes the nozzle out of the system and does not permit it to be used for subsequent assembly operations. If desired the machine operator may be alerted through the red warning light resident on the placement machine. At this point the operator has the option of removing the nozzle and replacing it with a new one or simply bypassing that nozzle and continuing on with production.

Figure 5:
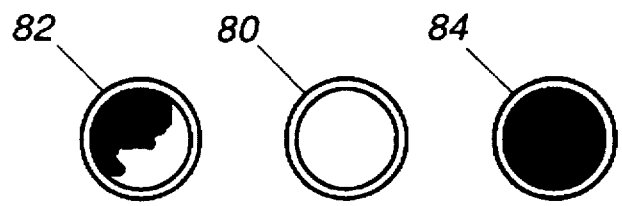
FIG. 5 is a pictorial description of three nozzle conditions.

FIG. 5 shows three typical cases of nozzle conditions. An unobstructed nozzle 80 appears to the camera to be completely white, that is the light shines through the nozzle and no obstruction is seen. A partially obstructed nozzle 82 shows a pattern of black in one or more portions of the nozzle. This pattern may extend from simply a partial obstruction (less than 10%) to nearly total obstruction (approaches 80–90%). A completely clogged nozzle 84 does not have any light exiting the nozzle opening, and thus appears as a black spot on the video camera.

In summary, a non-contact method for determining whether or not a vacuum pick up nozzle on a component placement machine has been obstructed has been shown. This method provides significant advantages over the prior art in that the vacuum nozzle and the machine turret are not hindered or encumbered by any additional wires or connections. The remotely located light source and remotely located camera provide complete freedom of the machine turret to operate in the normal fashion. In addition, since most component placement machines typically have a camera for inspection of the part orientation prior to placement on the substrate this same camera can also be used to verify the condition of the nozzle. A remote light source is easily mounted in any number of locations on the machine, and thus a cost effective, simple and highly reliable system has been created that provides a significant increase in the reliability and repeatability of high speed component placement machines.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of detecting whether an opening in tip face of a vacuum nozzle for a high speed component placement machine is obstructed, comprising the steps of:

illuminating the opening in the tip face of the vacuum nozzle from inside the vacuum nozzle by illuminating a hollow interior portion of the vacuum nozzle, to project a beam of light through the opening in the tip face;

measuring, by means of a remote detector exterior to the vacuum nozzle, intensity of light emanating from the opening in the tip face; and comparing the measured intensity of light emanating from the opening in the tip face to a predetermined standard in order to determine whether the opening in the tip face is obstructed.

2. The method as described in claim 1, further comprising a step, after the step of comparing, of clearing the opening in the tip face by pressurizing the vacuum nozzle to a level above ambient pressure.

3. The method as described in claim 2, wherein the steps of illuminating, measuring, and comparing are repeated after the step of clearing is performed.

4. The method as described in claim 3, further comprising a step, after the second occurrence of the comparing step, of clearing the nozzle opening by pressurizing the vacuum nozzle to a level above ambient pressure.

5. The method as described in claim 4, further comprising a final step, after a second occurrence of the clearing step, of designating the vacuum nozzle as inoperative.

6. The method as described in claim 1, wherein the step of measuring comprises viewing the illuminated opening in the tip face by means of a remote camera.

7. The method as described in claim 1, wherein the step of measuring further comprises:

capturing an image of the light emanating from the opening in the tip face; and creating a digitized image.

8. The method as described in claim 7, wherein the step of comparing comprises an algorithm for measuring the digitized image and comparing the digitized image to a set of standards in a lookup table.

9. The method as described in claim 1, wherein the step of illuminating further comprises illuminating by means of a remote light source that is mechanically dissociated from the vacuum nozzle.

10. A vacuum nozzle assembly for a high speed component placement machine, comprising:

a hollow tube having an opening in a tip face of one end;

a plastic light guide attached to the hollow tube, the plastic light guide having a first portion arranged to be illuminated by a light source that is remotely located from the vacuum nozzle assembly;

the plastic light guide having a second portion disposed to illuminate an interior portion of the hollow tube; and the plastic light guide conducting light from the light source from the first portion to the second portion to illuminate the opening in the tip face.

11. The vacuum nozzle assembly as described in claim 10, wherein the second portion is disposed in the interior of the hollow tube.

12. The vacuum nozzle assembly as described in claim 10, further comprising a nozzle block for mounting the vacuum nozzle assembly to the high speed component placement machine, the nozzle block attached to the hollow tube and the light guide disposed within the nozzle block.

13. The vacuum nozzle assembly as described in claim 12, wherein the first portion of the light guide comprises a window mounted in the nozzle block, and further comprising a channel in the nozzle block for conducting light from the window to illuminate the opening in the tip face.

14. The vacuum nozzle assembly as described in claim 12, wherein the first portion of the plastic light guide comprises a lens mounted in the nozzle block, and further comprising a channel in the nozzle block for conducting light from the window to illuminate the opening in the tip face.

15. A vacuum nozzle assembly for a high speed component placement machine, comprising:

a hollow tube having an opening in a tip face of one end;

a plastic light guide having an optical axis, a first portion, and a light extractor;

the first portion arranged to be illuminated by a light source that is remotely located from the vacuum nozzle assembly; and the light extractor disposed to illuminate an interior portion of the hollow tube;

the plastic light guide attached to the hollow tube such that light propagating in the plastic light guide in a direction generally along the optical axis and striking the light extractor will be reflected in a direction such that it will illuminate the opening in the tip face.

16. The vacuum nozzle assembly as described in claim 15, wherein the light extractor is disposed in the interior of the hollow tube.

17. The vacuum nozzle assembly as described in claim 15, wherein the plastic light guide is polycarbonate or acrylic plastic.

18. The vacuum nozzle assembly as described in claim 15, further comprising a nozzle block for mounting the vacuum nozzle assembly to the high speed component placement machine, the nozzle block attached to the hollow tube and the plastic light guide disposed within the nozzle block.

19. The vacuum nozzle assembly as described in claim 17, wherein the nozzle block is the plastic light guide.

20. The vacuum nozzle assembly as described in claim 18, wherein the nozzle block is polycarbonate or acrylic plastic.

* * * * *